United States Patent
Mughal et al.

(10) Patent No.: US 7,154,320 B2
(45) Date of Patent: Dec. 26, 2006

(54) FREQUENCY-BASED SLOPE-ADJUSTMENT CIRCUIT

(75) Inventors: Usman A. Mughal, Hillsboro, OR (US); Keng Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/093,643

(22) Filed: Mar. 29, 2005

(65) Prior Publication Data

US 2006/0220713 A1    Oct. 5, 2006

(51) Int. Cl.
*H03H 11/26*    (2006.01)
(52) U.S. Cl. .................. 327/261; 327/263; 327/270

(58) Field of Classification Search ............... 327/261, 327/276, 277, 284, 306, 263, 270
See application file for complete search history.

(56) References Cited

U.S. PATENT DOCUMENTS 3,068,417 A * 12/1962 Fiske .................. 327/174
6,650,159 B1    11/2003 Wang et al.
6,748,549 B1     6/2004 Chao et al.

* cited by examiner

*Primary Examiner*—Dinh T. Le
(74) *Attorney, Agent, or Firm*—Schwabe, Williamson & Wyatt, P.C.

(57) ABSTRACT

A method and apparatus for a frequency-based slope-adjustment circuit block are described herein.

23 Claims, 4 Drawing Sheets

FREQUENCY-BASED SLOPE-ADJUSTMENT CIRCUIT

TECHNICAL FIELD

Embodiments of the invention relate generally to the field of integrated circuits, and more particularly to an integrated circuit having a frequency-based slope-adjustment circuit block.

BACKGROUND

A delay line is often used in circuits to provide incremental delays to a signal such as an input-clocking signal. Taps at multiple points of the delay line may manifest clocking signals at increments equal to, at the finest resolution, the delay provided by one delay element of the delay line. To increase the resolution of the clocking signals output from the delay line, the output may be coupled to an interpolator. The interpolator may generate one or more interpolated signals between each of the delay-line clocking signals. Proper functioning of the interpolator will create the interpolated signals such that they are substantially homogeneous with the delay-line clocking signals. This may provide a downstream device access to a clocking signal having increased granularity.

Unfortunately, proper functioning of prior art interpolating devices requires a fairly static range of acceptable frequencies of the delay-line clocking signals. When the input edges become too far apart these prior art interpolating devices may generate an interpolated signal that is non-homogeneous with the rest of the output signal edges thereby compromising the output of the interpolator.

BRIEF DESCRIPTION OF THE DRAWINGS

Embodiments of the invention are illustrated by way of example and not by way of limitation in the figures of the accompanying drawings, in which like references indicate similar elements and in which.

DETAILED DESCRIPTION

Illustrative embodiments of the present invention include a dynamic frequency-based slope-adjustment circuit block.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific materials and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

Figure 1:
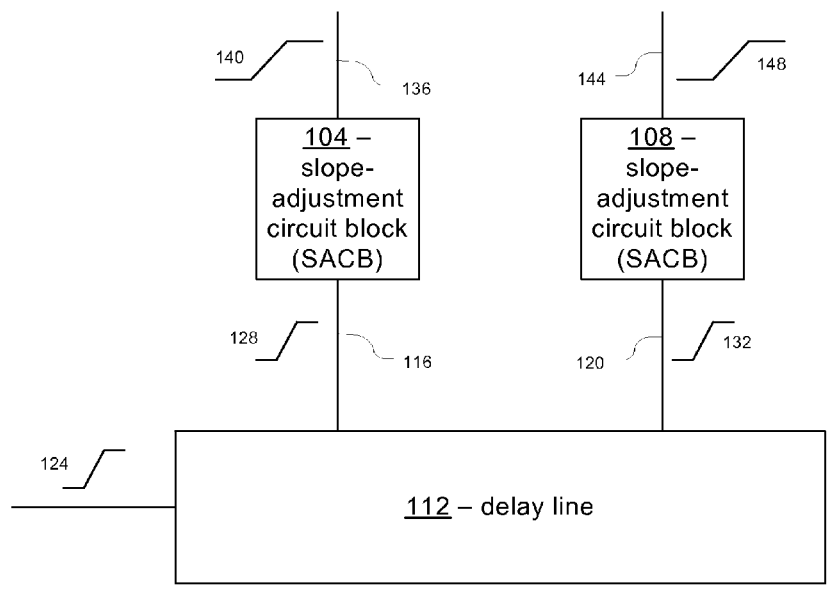
FIG. 1 illustrates a system including a slope-adjustment circuit block coupled to a delay line in accordance with an embodiment of the present invention.

FIG. 1 illustrates a slope-adjustment circuit block 104, a slope-adjustment circuit block 108, and a delay line 112, in accordance with an embodiment of the present invention. In this embodiment the delay line 112 may have a first tap 116, or signal line, electrically coupling the delay line 112 to the slope-adjustment circuit block 104, and a second tap 120 electrically coupling the delay line 112 to the slope-adjustment circuit block 108.

The delay line 112 may receive an input-clocking signal 124. The delay line 112 may delay the input-clocking signal 124 by a period, e.g., T0, and output a clocking signal 128 at the tap 116. The delay line 112 may delay the clocking signal 124 by an additional period, e.g., T1, from T0 and output a clocking signal 132 at the tap 120.

Figure 2:
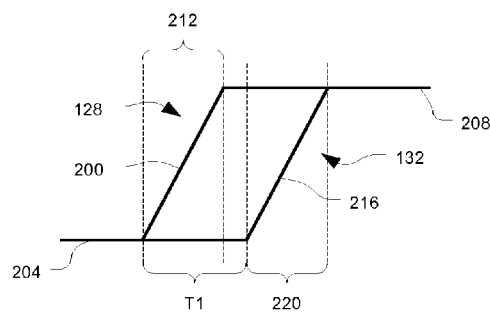
FIG. 2 illustrates a waveform of a first clocking signal of a delay line superimposed over a waveform of a second clocking signal of the delay line in accordance with an embodiment of the present invention.

FIG. 2 illustrates a waveform of the clocking signal 128 manifested at the tap 116 superimposed over a waveform of the clocking signal 132 manifested at the tap 120 in accordance with an embodiment of the present invention. In this embodiment, the clocking signal 128 may have a rising edge 200 that goes from a low value 204 to a high value 208 over a period 212. In this context, the edge 200 may have a slope S1 equal to the change in value (high value 208-low value 204) over the period 212. An edge 216 of the clocking signal 132 may likewise go from the low value 204 to the high value 208 over a period 220. Because the signal 128 and the signal 132 of this embodiment represent the same input signal 124 delayed by varying amounts, the two signals 128 and 132 may have similar waveform properties, e.g., period 212 may be approximately equal to period 220, and therefore the edge 216 may also have a slope S1.

As stated above with reference to FIG. 1, the delay line 112 may delay the clocking signal 132 the amount T1 from the clocking signal 128. In the context of FIG. 2, the initiation of the period 220 may be delayed by the amount T1 from the initiation of the period 212. If the amount T1 is greater than the period 212, as shown in FIG. 2, the periods 212 and 220 may be non-overlapping time periods. In various embodiments, slope sensitive circuits may have difficulty processing signals so arranged. For example, in one embodiment a downstream interpolator may have difficulty interpolating the signals 128 and 132 due to the non-overlapping of the edges 200 and 216. Interpolation in this situation may result in an interpolated signal with waveform properties that are non-homogenous to signals 128 and 132, e.g, the interpolated signal could have a stair-cased waveform with a mid-level plateau.

Referring again to FIG. 1, the slope-adjustment circuit block 104 may have a tap 136 to manifest an output-clocking signal 140 in accordance with an embodiment of the present invention. The clocking signal 140 may represent the clocking signal 128 with waveform properties adjusted to facilitate subsequent processing by a downstream slope sensitive device. In particular, and according to an embodiment of the present invention, the clocking signal 140 may represent the clocking signal 128 with a slope that has been adjusted based at least in part on T1. In a similar manner, the slope-adjustment circuit block 108 may have a tap 144 to manifest clocking signal 148. The clocking signal 148 may represent the clocking signal 132 with adjusted waveform properties, e.g., slope. In one embodiment the waveform properties of the clocking signal 140 and the clocking signal 148 may be similarly adjusted.

Figure 3:
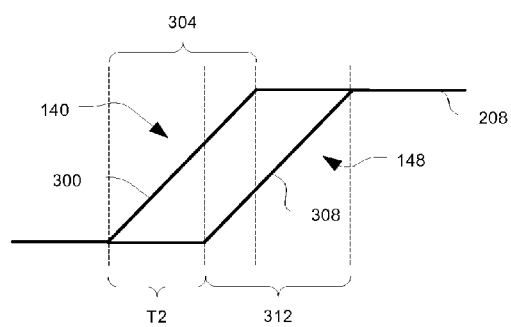
FIG. 3 illustrates a waveform of a slope-adjusted first clocking signal superimposed over a waveform of a slope-adjusted second clocking signal, in accordance with an embodiment of the present invention.

FIG. 3 illustrates a waveform of the clocking signal 140 manifested at the tap 136 superimposed over a waveform of the clocking signal 148 manifested at the tap 144 in accordance with an embodiment of the present invention. The clocking signal 140 may have a rising edge 300 with a slope S2. The rising edge 300 may occur over a time period 304. Likewise, the clocking signal 148 may have a rising edge 308 with a slope S2. The edge 308 may occur over a time period 312, the initiation of which may be delayed an amount T2 from the time period 304.

In one embodiment, operation of a downstream slope sensitive device may be facilitated by having incoming signal edges that overlap. In this embodiment, the slope-adjustment circuit blocks 104 and 108 may adjust the waveform properties so that slope S2 may be less than slope S1. A gentler slope S2 may allow the time period 312 to overlap with the time period 304, which may, in turn, facilitate the downstream processing of the clocking signals 140 and 148. In one embodiment, the slope adjustment may cause the edges 300 and 308 to overlap even though the amount of delay T2 is not changed from the incoming signal delay amount T1.

In an embodiment where a slope sensitive device includes, e.g., an interpolator, the output-clocking signals 140 and 148 may be more amenable to interpolation than the input-clocking signals 128 and 132.

Figure 4:
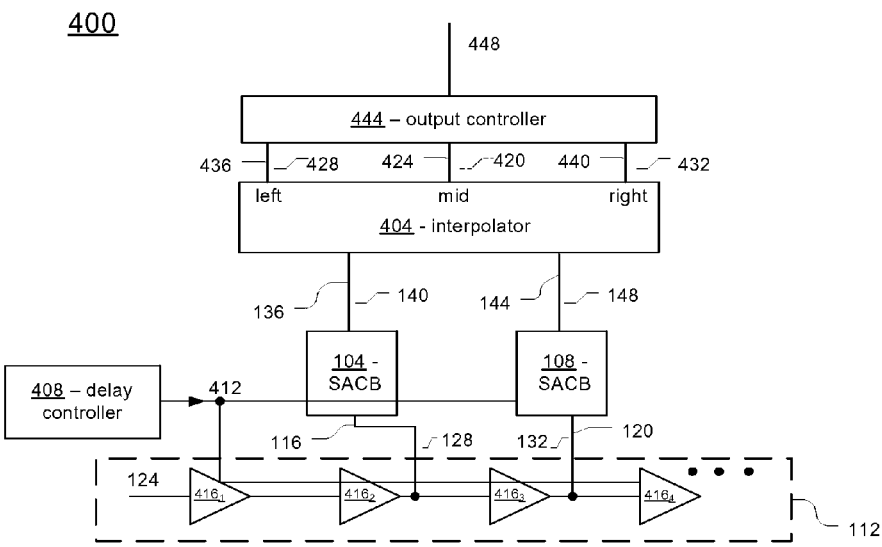
FIG. 4 illustrates a clocking circuit having slope-adjustment circuit blocks in accordance with an embodiment of the present invention.

FIG. 4 illustrates a clocking circuit 400 having the slope-adjustment circuit blocks 104 and 108 adjusting the waveform properties of clocking signals for an interpolator 404 in accordance with an embodiment of the present invention. In this embodiment a delay controller 408 coupled to the delay line 112 and to each of the slope-adjustment circuit blocks 104 and 108, may output a control signal 412. In one embodiment, the delay controller 408 may be a voltage-controlled oscillator of a phase-locked loop.

The delay line 112 may include a number of delay cells 416 coupled to one another in series. The taps 116 and 120 may be coupled to the outputs of the second delay cell 416 and the third delay cell 416 respectively. The control signal 412 may be provided to each of the delay cells 416 and may control the delay cells 416 in a manner to provide an incremental delay, e.g. T1, to the input-clocking signal 124. In one embodiment, each of the delay cells 416 may exhibit the same delay characteristics. In other embodiments, the delay cells 416 may have different delay characteristics.

As shown, the taps 116 and 120 are separated by one delay cell 4163; however, in other embodiments more than one delay cell 416 may be between two consecutive taps.

The slope-adjustment circuit blocks 104 and 108 may receive the control signal 412 as an indication of the frequency, e.g., T1, of the delay-line clocking signals 128 and 132. The slope-adjustment circuit blocks 104 and 108 may then adjust the waveform properties, e.g., slope S1, of the input-clocking signals 128 and 132, based at least in part on the indicated frequency, and output slope-adjusted clocking signals 140 and 148.

The slope-adjusted clocking signals 140 and 148 may then be provided to the interpolator 404 in accordance with an embodiment of the present invention. The interpolator 404 may generate a clocking signal 420 that is output along a tap 424. The clocking signal 420 may be based at least in part on the clocking signals 140 and 148. The interpolator 404 may also output-clocking signals 428 and 432 along taps 436 and 440, respectively. The clocking signals 428 and 432 may be based at least in part upon clocking signals 140 and 148, respectively. In one embodiment, the clocking signals 428 and 432 may represent the clocking signals 140 and 148 with adjusted slopes, which, in one embodiment, may be similar to the slope of the clocking signal 420.

In one embodiment, the interpolator 404 may output the signal 432 delayed from the signal 428 in an amount T2, similar to the amount of delay between the input signals 140 and 148. The signal 420 may be delayed from signal 428 by any amount that is between zero and T2. In one embodiment, the signal 420 may be delayed from the signal 428 by half of the amount T2 so that it is equidistant from the signals 428 and 432. Other embodiments may use other delay amounts.

In this manner, the interpolator 404 may provide an intermediate clocking signal 420 between the clocking signals 428 and 432. An output controller 444, coupled to the taps 424, 436, and 440, may be provided with a selection of edges to use in a clocking operation that has a finer granularity, or resolution, than the edges of the clock signals 128 and 132 provided by the delay line 112. In one embodiment, the output controller 444 may include a multiplexor and edge selection logic. The output controller 444 may selectively output one or more of the clock signals 428, 420, and 432 as part of an output-clocking signal 448 for use by a downstream device.

The embodiment shown and described with reference to FIG. 4 provides one level of interpolation. That is, one signal (signal 420) is generated between two end signals (signals 428 and 432). In various embodiments, the interpolator 404 may provide other levels of interpolation in order to provide any number of signals between the signals 428 and 432.

Figure 5:
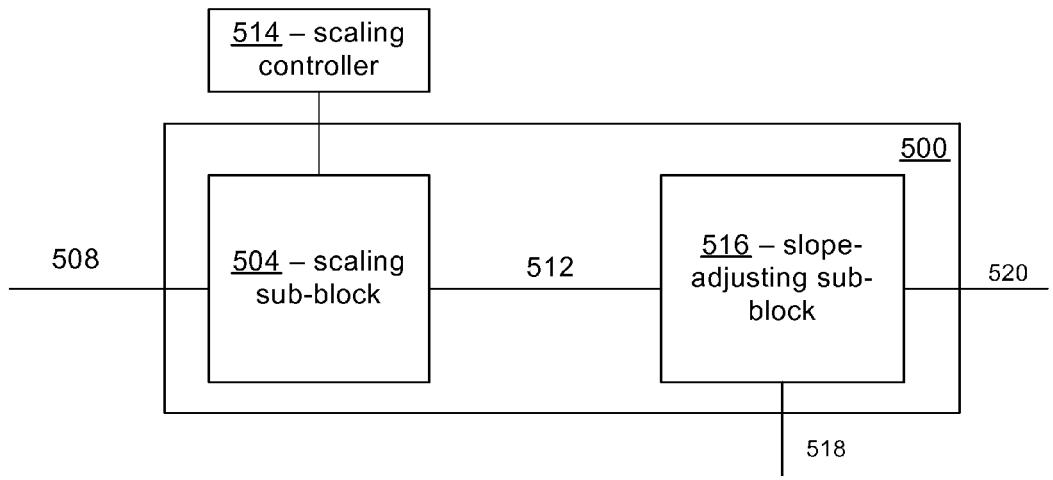
FIG. 5 illustrates a slope-adjustment circuit block in accordance with an embodiment of the present invention.

FIG. 5 illustrates a slope-adjustment circuit block 500 in accordance with an embodiment of the present invention. The slope-adjustment circuit block 500 may be similar to, and substantially interchangeable with, the slope-adjustment circuit block 104 and/or slope-adjustment circuit block 108. In this embodiment, the slope-adjustment circuit block 500 may have a scaling sub-block 504 adapted to receive a control signal from the delay controller. The control signal may have a biasing voltage 508 that is proportional to the frequency of the clocking signals output at consecutive taps of a delay line that may also be coupled to the delay controller. The scaling sub-block 504 may output an adjusted biasing voltage 512 that may represent the biasing voltage 508 scaled by a factor. In one embodiment, the scaling of the biasing voltage 508 may be controlled by a scaling controller 514. The scaling factor may be an amount designed to facilitate subsequent processing by a slope-adjusting sub-block 516 coupled to the scaling sub-block 504.

In one embodiment, the slope-adjusting sub-block 516 may also be coupled to receive an input-clocking signal 518. The slope-adjusting sub-block 516 may output a clocking signal 520 having waveform properties based at least in part on the adjusted biasing voltage 512 and the input-clocking signal 516. In particular, the value of the input-clocking signal 518 may at least in part determine a transition point into either a rising or a falling edge of the output-clocking signal 520. The value of the adjusted biasing voltage 512 may at least in part determine the rate at which the output-clocking signal 520 transitions between a high state and a low state, e.g., the slope of the edges. In one embodiment, the absolute value of the adjusted biasing voltage 512 may be directly proportional to the slope of the output-clocking signal 520. If the biasing voltage 508 is directly proportional to the frequency of the clocking signals output from the delay line, an increase in frequency may result in a decreased slope of the output-clocking signal 520.

Figure 6:
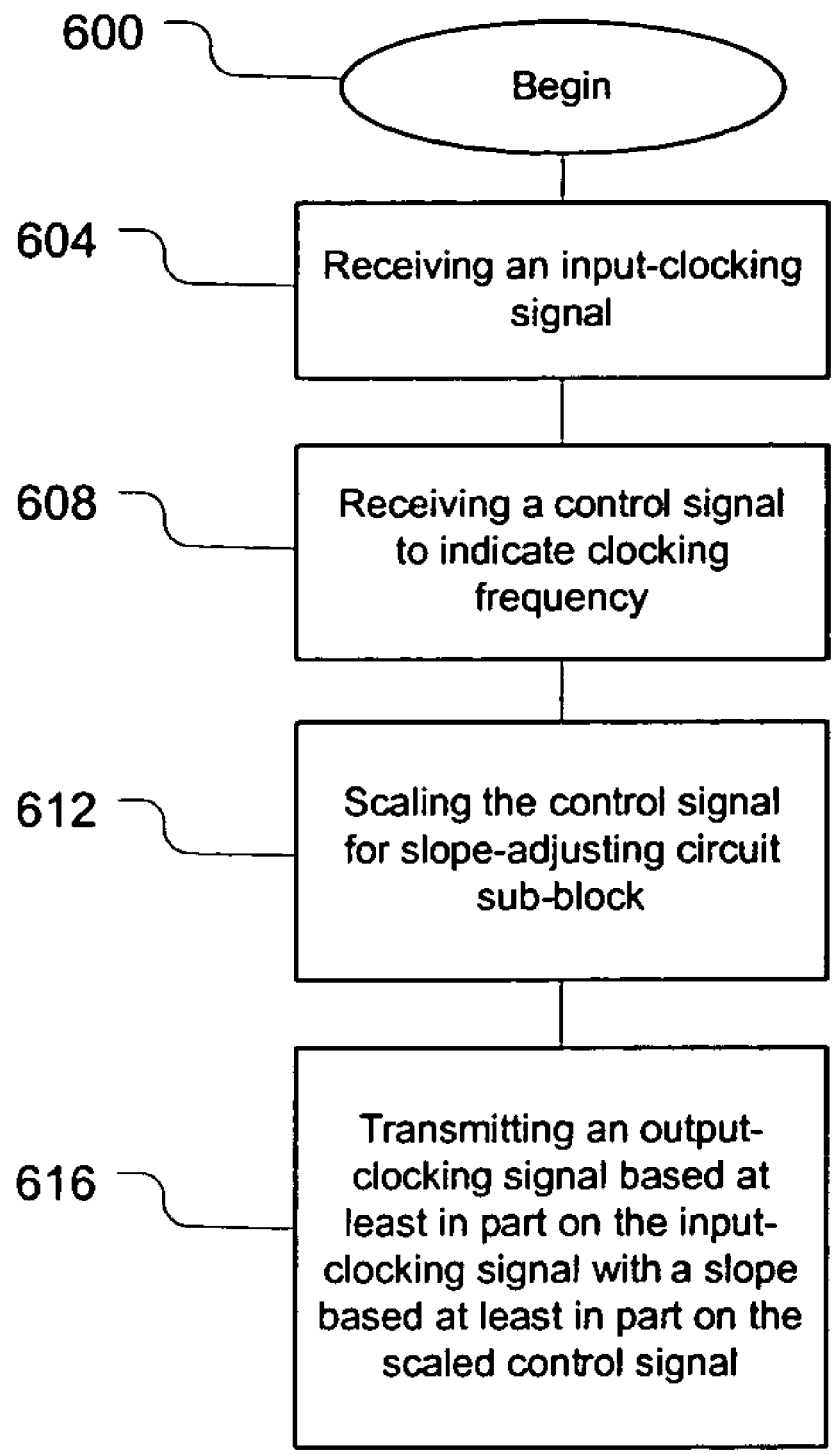
FIG. 6 illustrates a methodology of a slope-adjustment operation in accordance with an embodiment of the present invention.

FIG. 6 illustrates a methodology of a slope-adjustment operation in accordance with an embodiment of the present invention. The slope-adjustment operation of this embodiment may be used by any of the slope-adjustment circuit blocks described herein and in accordance with the teachings of embodiments of the present invention. At the initiation of a slope-adjustment operation 600 a slope-adjustment circuit block may operate by receiving an input-clocking signal 604. The input-clocking signal 604 may be, e.g., a system clock or an internally generated clock, which may be sequentially manifested along subsequent taps of a delay line. The slope-adjustment circuit block may also receive a control signal indicating frequency of the edge occurrence at the subsequent taps 608. In one embodiment, the frequency of the edge occurrence may be determined through a deterministic process by, e.g., having a circuit detect the time period between subsequent edges. In another embodiment, e.g., similar to the embodiment discussed with reference to FIG. 4, the frequency of the edge occurrence may be controlled at least in part by a common control signal that is fed to both the delay line and to the slope-adjustment circuit block.

In one embodiment, a received control signal may be scaled by a factor in order to provide a scaled control signal for a slope-adjusting circuit sub-block of a slope-adjustment circuit block 612. The slope-adjusting circuit sub-block may transmit an output-clocking signal based at least in part on an input-clocking signal. The output-clocking signal may have waveform properties with a characteristic edge slope that may be determined at least in part by the scaled control signal 616.

Figure 7:
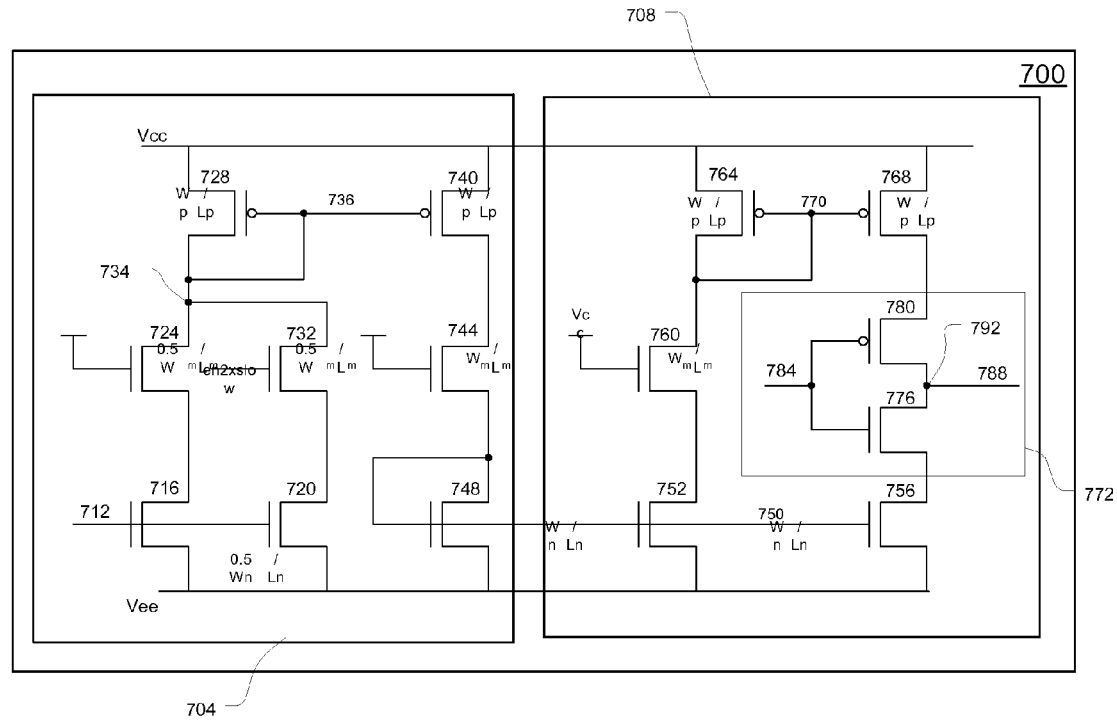
FIG. 7 illustrates a schematic of a slope-adjustment circuit block in accordance with an embodiment of the present invention.

FIG. 7 illustrates a schematic of a circuit diagram of a slope-adjustment circuit block 700 in accordance with an embodiment of the present invention. The slope-adjustment circuit block 700 may be similar to, and substantially interchangeable with the slope-adjustment circuit block 104, the slope-adjustment circuit block 108, and/or the slope-adjustment circuit block 500. In this embodiment, the slope-adjustment circuit block 700 may have a scaling circuit sub-block 704 coupled to a slope-adjusting sub-block 708 as shown. The scaling circuit sub-block 704 may be coupled to receive a control signal 712 from a delay controller. The control signal 712 may be coupled to a gate of an n-channel transistor 716 and a gate of an n-channel transistor 720. The transistor 716 and the transistor 720 may each be coupled to a lower-voltage power supply rail Vee, e.g., ground. The transistor 716 may act as a current source. In one embodiment the gate voltage of the control signal 712 may act as an nbias voltage to maintain the transistor 716 in a saturation region so that it may output a fixed current. The fixed current may be applied through an n-channel transistor 724, which may act as a digital-switching device, and through a p-channel transistor 728 coupled to a higher-voltage power supply rail Vcc.

The transistor 720 may act as a second current source. The addition of the current from the second current source may be controlled by an n-channel transistor 732, which may act as a digital-switching device. The gate of the transistor 732 may be coupled to scaling controller and, when activated, increase the current at a node 734. If the transistors 716 and 720 are of good dimensions, the current may be doubled at the node 734. The transistor 728 may develop a pbias voltage 736 that is consistent with the current at node 734. The pbias voltage 736 may be a shared gate voltage for the transistor 728 and a p-channel transistor 740 on a second branch of the scaling circuit sub-block 704. Therefore, if the transistor 728 has the same dimensions as the transistor 740, the current from the first branch may be mirrored in the second branch. This configuration may sometimes be referred to as a current mirror. In various embodiments, the transistor 728 may have different dimensions than the transistor 740 and the current in the second branch may be proportional to the current in the first branch.

The current in the second branch may travel through an n-channel transistor 744 that may act as a switching device. A gate voltage of an n-channel transistor 748, consistent with the current of the second branch, may be transmitted to the slope adjusting circuit sub-block 708 as a scaled control signal. The transmitted gate voltage may also be referred to as the adjusted nbias voltage 750.

In one embodiment, the adjusted nbias voltage 750 may be applied to a gate of an n-channel transistor 752 on a first branch of the slope adjusting circuit sub-block 708, and to a gate of an n-channel transistor 756 on a second branch of the slope-adjusting circuit sub-block 708. The transistor 752 and the transistor 756 may act as current sources for their respective branches.

The current sourced by the transistor 752 in the first branch may be mirrored to top of the second branch through an n-channel transistor 760, which may act as a digital switching device, and a current mirror configuration including a pair of p-channel transistors 764 and 768. Similar to the current mirror of the scaling circuit sub-block 704, an adjusted pbiased voltage 770 may act as a gate voltage for the transistor 764 and the transistor 768. The adjusted pbiased voltage may be a complement of the adjusted nbiased voltage 750.

The second branch of the slope-adjusting circuit sub-block 708 may have an inverter 772 coupled between the transistor 768 and the transistor 756. The inverter 772 may include an n-channel transistor 776 complementarily coupled to a p-channel transistor 780. The gates of the transistor 776 and the transistor 780 may be coupled to receive an input-clocking signal 784. A clocking signal 788 may be manifest at an output node 792 between the transistor 776 and the transistor 780.

The transistor 776 may be arranged as a pull-down network between the output node 792 and the lower-voltage power supply rail Vee. The rate at which the output node 792 may be pulled down, e.g., the slope of the falling edge of the clocking signal 788, may be determined by the state of the transistor 756, which is based at least in part upon the nbias voltage 712.

In a likewise fashion, the transistor 780 may be arranged as a pull-up network between the output node 792 and the higher-voltage power supply rail Vcc. The rate at which the output node 792 may be pulled up, e.g., the slope of the rising edge of the clocking signal 788, may be determined by the state of the transistor 768. In an embodiment having the adjusted pbiased voltage 700 being a complement of the adjusted nbiased voltage 750, the slope of the rising and falling edges of the clocking signal may be similar.

As previously mentioned, some embodiments, e.g., certain interpolation embodiments, may desire overlapping edges from clocking signals manifested along subsequent taps of a delay line. In one embodiment, the nbias voltage 712 of the control signal may be directly proportional to the frequency of those pre-interpolated clocking signals. As the nbias voltage increases the output-clocking signal 792 may have a steeper slope. Alternatively, as the nbias voltage 712 decreases, so too would the slope. Said another way, as the spacing of the initiation of the edges increases, the slope of the edges may decrease. This may provide increased edge overlapping throughout a range of frequencies of the pre-interpolated signals. This may, in turn, provide for an increased dynamic range of interpolation in accordance with embodiments of the present invention.

The embodiment discussed above includes the slope-adjustment circuit block 700 having semiconductor devices such as n- and p-channel transistors. These semiconductor devices are illustrated schematically to facilitate the discussion of the circuit characteristics. When implemented or manufactured these may comprise multiple devices depending, for example, upon the application or the particular integrated circuit chip. For example, as it is well known, some form of digital and/or analog circuit compensation may be included to address the potential variation in circuit parameters known to occur as a result of the fabrication process. Therefore, the simplified circuit diagrams are provided primarily for purposes of illustration and when actually implementing a particular slope-adjustment circuit block more complex circuitry may be employed to provide operations such as those described herein.

Also, certain logical functions schematically represented by a logic component should not be limited to that specific component.

Figure 8:
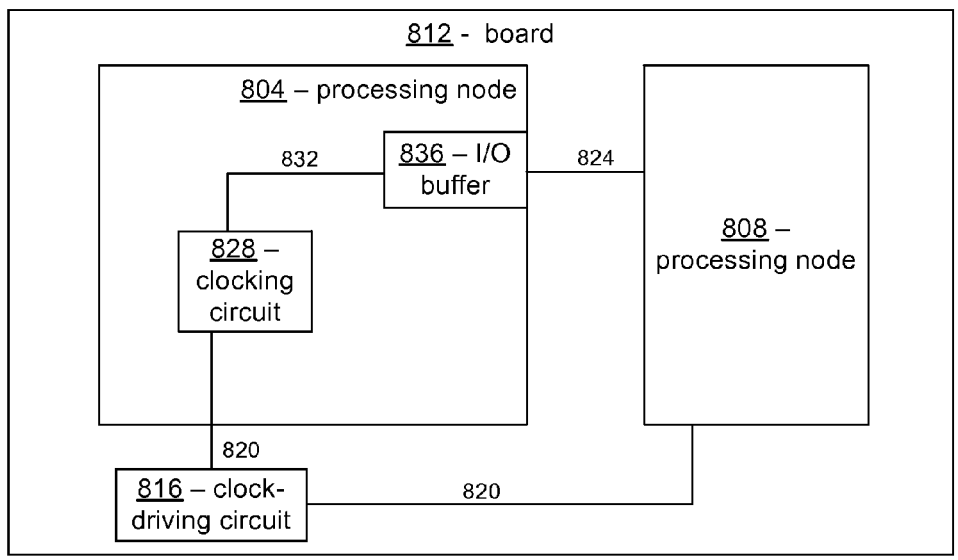
FIG. 8 illustrates a system with a processing node having a clock circuit in accordance with an embodiment of the present invention.

FIG. 8 illustrates a system 800 with a processing node 804 coupled to a processing node 808 in accordance with an embodiment of the present invention. In one embodiment, the processing node 804 and a processing node 808 may be disposed on a board 812, e.g., a motherboard. A clock driver circuit 816, which may also be disposed on the board 812 as shown, may be coupled to the processing node 804 and/or 808 to provide a system clock signal 820. Communicative signals may be sent between the processing nodes 804 and 808 over a bus 824 based at least in part on the system clock signal 820.

In various embodiments, the clock driver circuit 816 may be alternatively disposed on the processing node 804 or the processing node 808.

The processing node 804 may include a clocking circuit 828 having one or more slope-adjustment circuit blocks in accordance with an embodiment of the present invention. In one embodiment, the clocking circuit 828 may generate an internal clocking signal 832 based at least in part on the system clock signal 820.

The processing node 804 may include an input/output (I/O) buffer 836 coupled to the clocking circuit 828 and to the bus 824. The I/O buffer 836 may operate to buffer input data from an external data source, such as the processing node 808, and/or to buffer output data from the processing node 804 to an external data sink, e.g., processing node 808. The I/O buffer 836 may buffer input and/or output data based at least in part on an internal clocking signal 832 provided by the clocking circuit 828. The clocking circuit 828 may facilitate system clock management by providing flexible clocking schemes for distributed components. In one embodiment the internal clocking signal 832 may represent the system clock signal 820 adjusted to compensate for issues related to a centralized clock distribution. For example, clock skew may result from minor variations in the time at which the system clock signal 820 arrives at the processing nodes 804 and 808. If these variations are significant and uncompensated for, the reliability of the data transfer between the processing nodes 804 and 808 may be compromised. In various embodiments the dynamic range of interpolation provided by the slope-adjustment circuit blocks may be utilized in conjunction with, or as a part of, skew correction circuitry to compensate for these variations with a high degree of resolution. Skew correction circuitry could include, but is not limited to, phase-locked loops (PLLs) and delay-locked loops (DLLs). In such a manner the clocking circuit 828 may align the internal clocking signal 832 with the clocking signal received by other components of the system 800, e.g., the processing node 808.

As discussed above, the clocking circuit 828 may function as a clock alignment/synchronization circuit. In an alternative embodiment, a clocking circuit similar to the clocking circuit 828, may serve as a flexible clock generation circuit for the processing node 804, the processing node 808, and/or other components of the system 800. In this embodiment a local clocking signal may be generated independent of a system clock signal. Events in the local processing node or some external control device (not shown) may cause a change in the frequency of the internal clocking signal 832, which may, in turn, be facilitated by the dynamic range of the interpolation provided by the slope-adjustment circuit blocks of the clocking circuit.

In one embodiment, the processing node 804 may be a processor, such as a network processor or a central processing unit (CPU). In one embodiment, the processing node 808 may be a hub chipset adapted to couple the processing node 804 to a number of other components such as, but not limited to, memory, a graphics processor, a mass storage device, and other I/O modules. Examples of the memory include but are not limited to static random access memory (SRAM) and dynamic random access memory (DRAM). Examples of the mass storage device include but are not limited to a hard disk drive, a compact disk drive (CD), a digital versatile disk drive (DVD), and so forth. Examples of other input/output modules include but are not limited to a network interface, a keyboard, cursor control devices, a display, and so forth.

In various embodiments, the system 800 may include, but is not limited to, a wireless mobile phone, a personal digital assistant, a tablet personal computer (PC), a notebook PC, a desktop PC, a network switch, a network router, a set-top box, an audio/video controller, a media player, a compact disk/digital versatile disk (CD/DVD) player, and a server.

Accordingly, methods and apparatuses for a frequency-based slope-adjustment circuit block have been described. Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:

1. A circuit comprising:
    a delay line having
        a first tap adapted to manifest a first signal having a first edge with a first slope, and
        a second tap adapted to manifest a second signal having a second edge with a second slope, an initiation of the second edge being delayed from an initiation of the first edge by an amount of time; and
    a first circuit block coupled to the first tap and adapted to receive the first signal, to determine the amount of time, and to output a third signal having a third edge with a third slope, the third slope based at least in part on the amount of time.

2. The circuit of claim 1, wherein the first edge and the second edge are edges.

3. The circuit of claim 1, further comprising:
    a delay controller coupled to the first circuit block and the delay line and adapted to output a control signal with a first voltage level to control the delay line to delay the initiation of the second edge from the initiation of the first edge by the amount of time.

4. The circuit of claim 3, wherein the first circuit block is further adapted to output the third signal having the third edge with the third slope based at least in part on the control signal.

5. The circuit of claim 4, wherein the third slope is proportional to the first voltage level.

6. The circuit of claim 4, further comprising:
    a second circuit block coupled to the second tap and to the delay controller and adapted to receive the second signal, to receive the control signal, and to output a fourth signal having a fourth edge with a fourth slope, the fourth slope based at least in part on the control signal.

7. The circuit of claim 6, further comprising:
    an interpolator coupled to the first circuit block and the second circuit block and adapted to receive the third signal and the fourth signal, and to output a fifth signal based at least in part on the third and fourth signals.

8. The circuit of claim 7, wherein the interpolator is further adapted to output a sixth signal and a seventh signal based at least in part on the third signal and the fourth signal, respectively.

9. The circuit of claim 3, wherein the first circuit block comprises:
    a scaling circuit sub-block, adapted to receive the control signal and to provide a scaled control signal with a second voltage level by scaling the control signal by a factor; and
    a slope-adjusting circuit sub-block coupled to the scaling circuit sub-block and adapted
        to receive the scaled control signal from the scaling circuit sub-block,
        to receive the first signal, and
        to output the third signal having the third edge with the third slope based at least in part on the second voltage level.

10. A method comprising:
    receiving a first signal having a first edge with a first slope output from a first tap of a delay line;
    receiving a control signal indicative of a duration between the output of the first edge of the first signal from the first tap and an output of a second edge of a second signal having a second slope from a second tap of the delay line; and
    transmitting a third signal, derived from the first signal, having a third edge with a third slope, the third slope based at least in part on the control signal.

11. The method of claim 10, wherein said receiving of the first signal, said receiving of the control signal, and said transmitting of the third signal are done by a first circuit block.

12. The method of claim 11, further comprising:
    receiving by a second circuit block the second signal from the second tap of the delay line;
    receiving by the second circuit block the control signal; and
    transmitting by the second circuit block a fourth signal having a fourth edge with a fourth slope, the fourth slope based at least in part on the control signal.

13. The method of claim 12, further comprising:
    receiving by an interpolator the third signal and the fourth signal; and
    transmitting by the interpolator a fifth signal based at least in part on the third signal and the fourth signal.

14. The method of claim 10, further comprising:
    providing a scaled control signal by scaling the control signal by a factor; and
    transmitting the third signal having the third edge with the third slope based at least in part on the scaled control signal.

15. A system comprising:
    a board;
    a clock driver disposed on the board and adapted to generate a first clocking signal;
    a first processing node disposed on the board and coupled to the clock driver, the processing node having
        a delay line adapted
            to receive the first clocking signal,
            to manifest a first signal on a first tap having a first edge with a first slope based at least in part on the first clocking signal, and
            to manifest a second signal on a second tap having a second edge with a second slope based at least in part on the first clocking signal, an initiation of the second edge being delayed from an initiation of the first edge by an amount of time; and
        a first circuit block coupled to the first tap and adapted to receive the first signal to determine the amount of time, and to output a third signal having a third edge with a third slope, the third slope based at least in part on the amount of time.

16. The system of claim 15, wherein the first processing node further comprises:
    a delay controller coupled to the first circuit block and the delay line and adapted to output a control signal with a first voltage level to control the delay line to delay the initiation of the second edge from the initiation of the first edge by the amount of time.

17. The system of claim 16, wherein the first processing node further comprises
    a second circuit block coupled to the second tap and adapted
        to receive the second signal, and to output a fourth signal having a fourth edge with a fourth slope, the fourth slope based at least in part on the amount of time.

18. The system of claim 17, wherein the first processing node further comprises:
an interpolator coupled to the first circuit block and the second circuit block and adapted to receive the third signal and the fourth signal, and having
a first interpolator tap to output a fifth signal based at least in part on the third signal,
a second interpolator tap to output a sixth signal based at least in part on the third signal and the fourth signal, and
a third interpolator tap to output a seventh signal based at least in part on the fourth signal.

19. The system of claim 18, wherein the first processing node further comprises:
an output controller coupled to the first, the second, and the third interpolator taps and adapted to selectively output at least one signal of the group consisting of the fifth signal, the sixth signal, and the seventh signal as part of an internal clocking signal.

20. The system of claim 19, wherein the first processing node further comprises:
an input/output buffer coupled to the output controller and adapted to receive the internal clocking signal and to operate to buffer input data from an external data source or buffer output data for an external data sink, based at least in part on the internal clocking signal.

21. The system of claim 15, further comprising:
a second processing node disposed on the board and coupled to the clock driver to receive the first clocking signal and coupled to the first processing node.

22. The system of claim 21, wherein the first processing node comprises a microprocessor and the second processing node comprises a hub chipset.

23. The system of claim 15, wherein the system is a device selected from the group consisting of a personal digital assistant, a network switch, a network router, a set-top box, an audio/video controller, a media player, a compact disk/digital versatile disk player, and a server.

* * * * *

UNITED STATES PATENT AND TRADEMARK OFFICE
CERTIFICATE OF CORRECTION

PATENT NO. : 7,154,320 B2 Page 1 of 1
APPLICATION NO. : 11/093643
DATED : December 26, 2006
INVENTOR(S) : Mughal et al.

It is certified that error appears in the above-identified patent and that said Letters Patent is hereby corrected as shown below:

Column 4

Line 4, "...cell 4163; ..." should read --...cell 416$_3$; ...--.

Column 9

Line 25, "[Claim 2.] ...edge are edges." should read --...edge are non-overlapping edges.--

Column 10

Line 52, "[Claim 15] ...first signal to determine..." should read --...first signal, to determine...--.

Signed and Sealed this

Thirteenth Day of May, 2008

JON W. DUDAS
*Director of the United States Patent and Trademark Office*